(12) United States Patent
Inamoto et al.

(10) Patent No.: US 10,161,982 B2
(45) Date of Patent: Dec. 25, 2018

(54) FAILURE INSPECTION SYSTEM ENABLING DISCRIMINATION BETWEEN LEAKAGE CURRENT FAILURE AND SHORT-CIRCUIT FAILURE

(71) Applicant: DENSO CORPORATION, Kariya, Aichi-pref. (JP)

(72) Inventors: Takashi Inamoto, Kariya (JP); Masakatsu Horiguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 96 days.

(21) Appl. No.: 15/348,183

(22) Filed: Nov. 10, 2016

(65) Prior Publication Data

US 2017/0131339 A1    May 11, 2017

(30) Foreign Application Priority Data

Nov. 10, 2015  (JP) ................... 2015-220694

(51) Int. Cl.
*G01R 31/02* (2006.01)
*G01R 31/40* (2014.01)

(52) U.S. Cl.
CPC .......... *G01R 31/025* (2013.01); *G01R 31/40* (2013.01)

(58) Field of Classification Search
None
See application file for complete search history.

(56) References Cited

U.S. PATENT DOCUMENTS

| 2011/0049977 A1* | 3/2011 | Onnerud ............... B60L 3/0046 307/9.1 |
| 2015/0060423 A1 | 3/2015 | Tanaka et al. |
| 2016/0223615 A1* | 8/2016 | Nishi ................... H01H 47/002 |

FOREIGN PATENT DOCUMENTS

| JP | 2010-145376 A | 7/2010 |
| JP | 2015-035708 A | 2/2015 |

* cited by examiner

*Primary Examiner* — Jermele M Hollington
*Assistant Examiner* — Douglas X Rodriguez
(74) *Attorney, Agent, or Firm* — Oliff PLC

(57) ABSTRACT

A failure inspection system includes a main circuit section, an electrically conductive member, capacitors, a signal generating section, a measurement section and a judgement section. The signal generating section generates a high-frequency AC signal and a low-frequency AC signal. The judgement section determines whether either one of two types of failure has occurred based on the voltage or the current of the high-frequency AC signal. If it is determined that a failure is occurring, the judgment section specifies that which of failures, a leakage current failure or a short-circuit failure, the failure that has occurred is, based on a measurement value of the low-frequency AC signal derived from the measurement section.

3 Claims, 19 Drawing Sheets

FAILURE INSPECTION SYSTEM ENABLING DISCRIMINATION BETWEEN LEAKAGE CURRENT FAILURE AND SHORT-CIRCUIT FAILURE

CROSS-REFERENCE TO RELATED APPLICATION

This application is based on and claims the benefit of priority from earlier Japanese Patent Application No. 2015-220694 filed Nov. 10, 2015, the description of which is incorporated herein by reference.

BACKGROUND

Technical Field

The present invention relates to a failure inspection system for inspecting leakage of a DC power source, and for inspecting a short-circuit failure of switches provided between the DC power source and an electrical apparatus.

Related Art

There is known a failure inspection system having a pair of power lines which connect a DC power source to an electrical apparatus, switches provided in the power lines, and a judgement section which judges whether or not there is a leakage current failure of the DC power source or a short-circuit failure of a switch (see JP-A-2015-065143).

The failure inspection system includes capacitors that are coupled between the power lines and ground, each capacitor disposed at a position of a power line which is closer to the electrical apparatus than the switch is. The failure inspection system also includes a signal generating section which generates an AC signal, and a measurement section which measures the voltage of the AC signal. The signal generating section and the measurement section are provided at a position which is closer to the DC power source than the switch is. When there is a short-circuit of a switch, the AC signal generated by the signal generating section passes through the switch, and flows through a capacitor to ground, and thus the voltage of the AC signal as measured by the measurement section becomes lowered. The judgement section judges, for example, that there is a failure when the measured voltage of the AC signal falls below a predetermined threshold.

Furthermore, when a leakage current failure occurs in the DC power source, the AC signal generated by the signal generating section passes through the leakage position, and flows to ground, so that the measured value of voltage of the AC signal is reduced.

Hence, in this case too, if the measured value of voltage of the AC signal falls below a predetermined threshold, it can be judged that a failure has occurred.

However, the above failure inspection system suffers from a problem that the occurrence of a leakage current failure cannot be distinguished from the occurrence of a short-circuit failure. That is to say, when a leakage current failure occurs, the AC signal flows to ground through a leakage current position, so that the measured value of AC signal voltage becomes reduced. When a short-circuit failure of a switch occurs, the AC signal flows to ground through the switch and a capacitor so that again, the measured value of AC signal voltage becomes reduced. Thus, the measured value of the AC signal voltage decreases in either case, so that it is impossible to distinguish between the two types of failure.

In consideration of the foregoing, exemplary embodiments of the present invention are directed to providing a failure inspection system that uses an AC signal to determine which of two types of failure has occurred, specifically, a leakage current failure or a short-circuit failure.

SUMMARY

In accordance with an exemplary embodiment of the present invention, there is provided a failure inspection system. The system includes: a main circuit section including a DC power source, a pair of power lines connecting the DC power source to an electrical apparatus, and a pair of switches connected respectively to corresponding ones of the power lines; an electrically conductive member connected to ground and electrically insulated from the power lines; a plurality of capacitors respectively coupled between the conductive member and the power lines, each capacitor connected to a power line at a position closer to the electrical apparatus than is the corresponding one of the switches; a signal generating section electrically connected to a main circuit first section and configured to generate two types of AC signal, including a high-frequency AC signal having a relatively high frequency and a low-frequency AC signal having a frequency lower than that of the high-frequency AC signal, the main circuit first section being a part of the main circuit section and being at a position closer to the DC power source than are the pair of switches; a measurement section electrically connected to the main circuit first section, and configured to measure respective values of voltage or of current of the two types of AC signal; and a judgement section configured to detect either of a leakage current failure in the DC power source and a short-circuit failure in the switches, based on measured values of AC signal voltage or AC signal current obtained by the measurement section. The judgement section is configured to judge occurrence of either one of the two types of failure based on a measured value of the high-frequency AC signal obtained by the measurement section, and, when it is judged that either of the two types of failure is occurring, to specify the failure as being a short-circuit failure or a leakage current failure based on a measured value of the low-frequency AC signal obtained by the measurement section.

The signal generating section of such a failure inspection system is configured to generate two types of AC signal, i.e. a high-frequency AC signal and a low-frequency AC signal. Therefore, the judgement section can specify which failure, a leakage current failure or a short-circuit failure, has occurred.

Specifically, the judgement section is configured to first determine whether either of the two types of failure has occurred, by using the measured value of the high-frequency AC signal. Use of the high-frequency AC signal enables judgement as to whether either of a leakage current failure and a short-circuit failure has occurred, although distinction cannot be made between the failures. More specifically, if there is a short-circuit failure of a switch, the high-frequency AC signal will pass through that switch and then through a capacitor, to flow to ground. If there is a leakage current failure of the DC power source, then the high-frequency AC signal will pass through leakage current portion and flow to ground. Hence, when the measurement section measures the voltage of the high-frequency AC signal, if either of the two types of failure has occurred, the measured value of voltage will become lowered. Thus, if the measured value of the voltage is below a predetermined value, it can be judged that a failure has occurred, although the specific type of failure cannot be determined.

The judgement section is further configured such that, if it has been determined by using the high-frequency AC signal that a failure has occurred, a low-frequency AC signal is then used in specifying which of the two types of failure, a short-circuit failure or a leakage current failure, has occurred. For example, if there is a short-circuit failure of a switch, and no leakage current failure, the low-frequency AC signal can pass through the switch concerned. However, since each of the capacitors presents a high impedance to the low-frequency AC signal, the low-frequency AC signal cannot pass through a capacitor. Therefore, the low-frequency AC signal cannot flow to ground. Thus, the measured value of the low-frequency AC signal voltage, measured by the measurement section, will remain high. Also, when a leakage current failure occurs, while there is no short-circuit failure, the low-frequency AC signal will pass through the leakage portion and flow to ground. Hence, the measured value of the low-frequency AC signal voltage, as measured by the measurement section, will become lowered. Thus, if the measured value of the high-frequency AC signal voltage is above a predetermined threshold, it is determined that a short-circuit failure has occurred, but if found to be below a predetermined threshold, it is determined that a leakage current failure has occurred.

If values of measured current of the AC signals are utilized, it is similarly possible to specify which failure, a short-circuit failure or a leakage current failure, has occurred.

With the above form of the present invention, there is provided a failure inspection system that is capable of judging which one of two types of failure has occurred, i.e. a leakage current failure or a short-circuit failure, utilizing a low-frequency AC signal.

The term "short-circuit failure" of a switch, as used herein, is to be understood as signifying that the switch remains in an on state if the switch is controlled so as to be turned off. For example, the short-circuit failure may result from the switch contacts being welded together, or could result from a failure of a spring member or a drive circuit in the relay.

DESCRIPTION OF EMBODIMENTS

Embodiments of the present invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

A failure inspection system according to the present invention may be applied as a vehicle-use failure inspection system, for installation on an electric vehicle, a hybrid vehicle, etc.

First Embodiment

Figure 1:
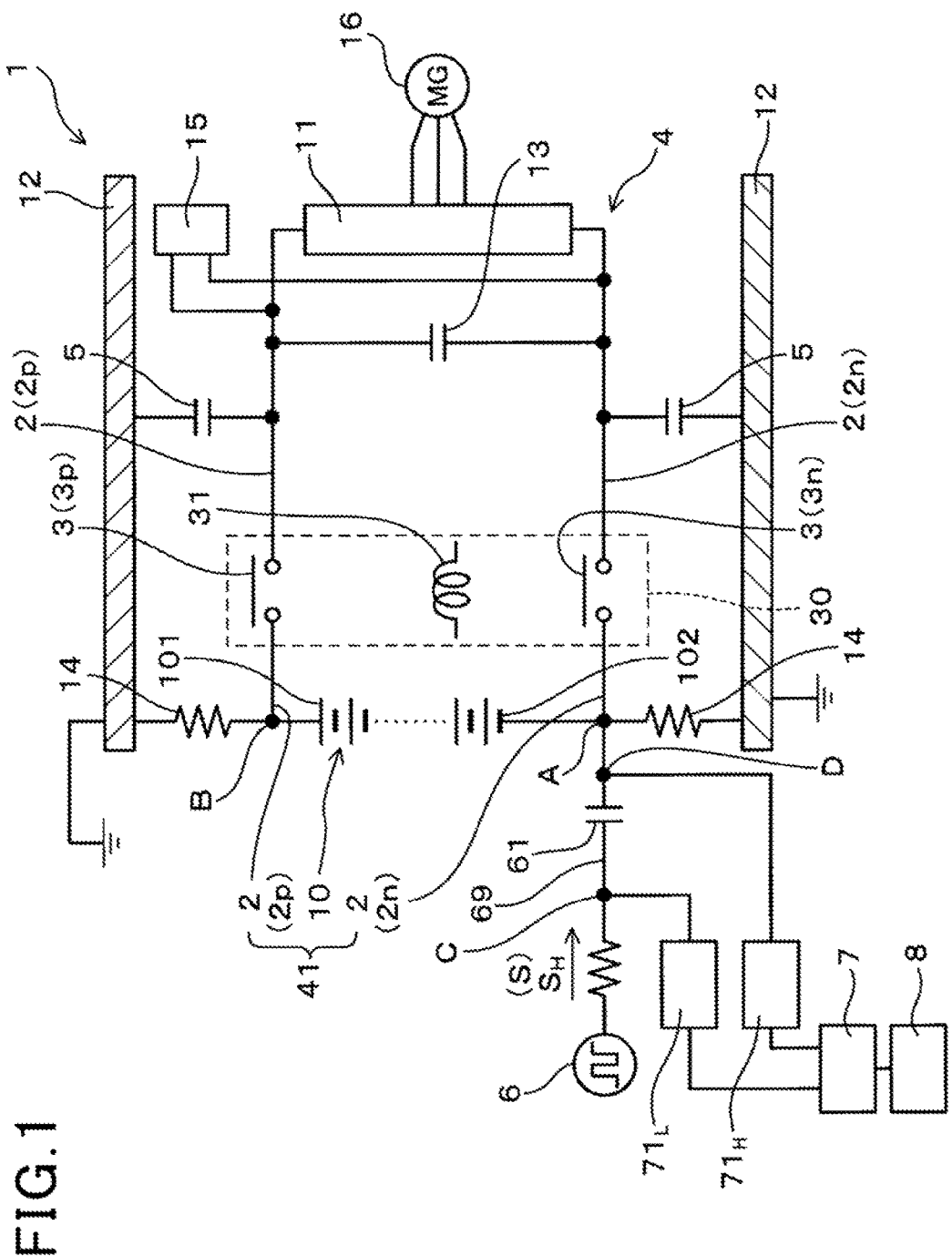
FIG. 1 shows a circuit diagram illustrating a failure inspection system in a condition in which a high-frequency AC signal is being generated when neither a short-circuit failure nor a leakage current failure has occurred, according to a first embodiment of the present invention.

With reference to FIGS. 1 to 9, a first embodiment of a failure inspection system will be described. As shown in FIG. 1, a failure inspection system 1 includes a main circuit section 4, a conductive member 12 which is electrically conductive, capacitors 5, a signal generating section 6, a measurement section 7, and a judgement section 8. The main circuit section 4 includes a DC power source 10, a pair of power lines 2 (2$p$, 2) and a pair of switches 3 (3$p$, 3$n$).

The pair of power lines 2 (2$p$, 2$p$) connect the DC power source 10 to the electrical apparatus 11. The pair of switches 3 (3$p$, 3$n$) are respectively installed in the pair of power lines 2 (2$p$, 2$n$).

The conductive member 12 is electrically insulated from the power lines 2, and is connected to ground. Capacitors 5 are respectively provided, being coupled between the conductive member 12 and the power lines 2$p$, 2$n$, at positions closer to the electrical apparatus 11 than the pair of switches 3$p$, 3$n$ are.

The signal generating section 6 is electrically connected to a main circuit first section 41 which is at a position closer to the DC power source 10 than the switches 3$p$, 3$n$ in the main circuit section 4 are. The signal generating section 6 generates two types of AC signal S, i.e., a high-frequency AC signal $S_H$ having a relatively high frequency (see FIG. 2), and a low-frequency AC signal $S_L$ having a lower frequency than that of the high-frequency AC signal $S_H$ (see FIG. 3).

The measurement section 7 is electrically connected to the main circuit first section 41, and measures the voltage of the AC signal S.

Based on the voltage of the AC signal S as measured by the measurement section 7, the judgement section 8 judges whether either of two types of failure have occurred. The two types of failure consist of a leakage current failure whereby a leakage current flows from the DC power source 10, and a short-circuit failure whereby a switch 3 is in a short-circuit condition.

Based on the measured value of the high-frequency AC signal $S_H$ obtained by the measurement section 7, the judgement section 8 judges whether or not either of the two types of failure has occurred. If it is judged that a failure has occurred, the judgement section 8 is configured to specify which failure, a leakage current failure or a short-circuit failure, has occurred, based on the measured value of the low-frequency AC signal $S_L$ obtained by the measurement section 7.

The failure inspection system 1 may be applied as a vehicle-use system, for installation on an electric vehicle, a hybrid vehicle, etc.

The electrical apparatus 11 is a power converter apparatus, which converts the DC power of the DC power source 10 to AC power. The AC power thus obtained is used for driving a 3-phase AC motor 16 to run the vehicle.

As shown in FIG. 1, the power lines 2 is made up of a positive-side power line 2$p$ which connects a positive terminal 101 of the DC power source 10 to the electrical apparatus 11, and a negative-side power line 2$n$ which connects a negative terminal 102 of the DC power source 10 to the electrical apparatus 11. The switches 3 is made up of a positive-side switch 3$p$ installed in the positive-side power line 2$p$, and a negative-side switch 3$n$ installed in the negative-side power line 2$n$. The two switches 3$p$, 3$n$ are contained within a relay 30 together with a single magnetic coil 31. The relay 30 is configured such that, when a current is passed through the magnetic circuit 31, both of the switches 3$p$, 3$n$ are turned on, while when the current flow is halted, both of the switches 3$p$, 3$n$ are turned off.

A smoothing capacitor 13 is connected in parallel with the electrical apparatus 11, for smoothing the DC voltage that is applied to the electrical apparatus 11. A charging apparatus 15 is connected parallel to the smoothing capacitor 13. The charging apparatus 15 is used to charge the smoothing capacitor 13 prior to starting the electrical apparatus 11. A sudden surge of current into the smoothing capacitor 13 at the time of switch-on of the switches 3$p$, 3$n$ can thereby be prevented. The charging apparatus 15 can be a bi-directional DC-to-DC converter, for example.

Furthermore, as described above, the embodiment further includes a conductive member 12 which is connected to ground, and which consists of the body of the vehicle. The capacitors 5 are coupled between the power lines 2 and the conductive member 12, at positions closer to the electrical apparatus 11 than the switches 3 are. With this embodiment, the capacitors 5 are made up of specific electronic parts such as ceramic capacitors. The capacitors 5 have a given capacitance so as to pass the high-frequency AC signal $S_H$, while passing almost none of the low-frequency AC signal $S_L$.

As shown in FIG. 1, resistors 14 are interposed between the DC power source 10 and the conductive member 12 to electrically insulate therebetween. When a leakage current failure occurs, current flows from the DC power source 10 through the resistors 14. Parasitic capacitors (not shown) are connected in parallel with the resistors 14, however since the value of capacitance of such a parasitic capacitor is much smaller than that of a capacitor 5, they are not indicated in the drawings.

The signal generating section 6 is electrically connected via a signal line 69 to the main circuit first section 41, at a position (connection point A) in the main circuit first section 41 that is at the same potential as the negative terminal 102 of the DC power source 10. A measurement capacitor 61 is provided between the connection point A and the signal generating section 6, and serves to electrically isolate the signal generating section 6 from the DC power source 10. The capacitance value of the measurement capacitor 61 is predetermined such that both the high-frequency AC signal $S_H$ and the low-frequency AC signal $S_L$ can be passed by that capacitor.

A high-frequency filter $71_H$ and a low-frequency filter $71_L$ are connected between the measurement section 7 and the signal line 69. The high-frequency filter $71_H$ passes only the high-frequency AC signal $S_H$ of the AC signal S generated by the signal generating section 6, while the low-frequency filter $71_L$ passes only the low-frequency AC signal $S_L$. The low-frequency filter $71_L$ is connected to the signal line 69 at a position (first connection point C) which is closer to the signal generating section 6 than the measurement capacitor 61 is. The high-frequency filter $71_H$ is connected to the signal line 69 at a position (second connection point D) which is farther from the signal generating section 6 than the measurement capacitor 61 is.

Figure 2:
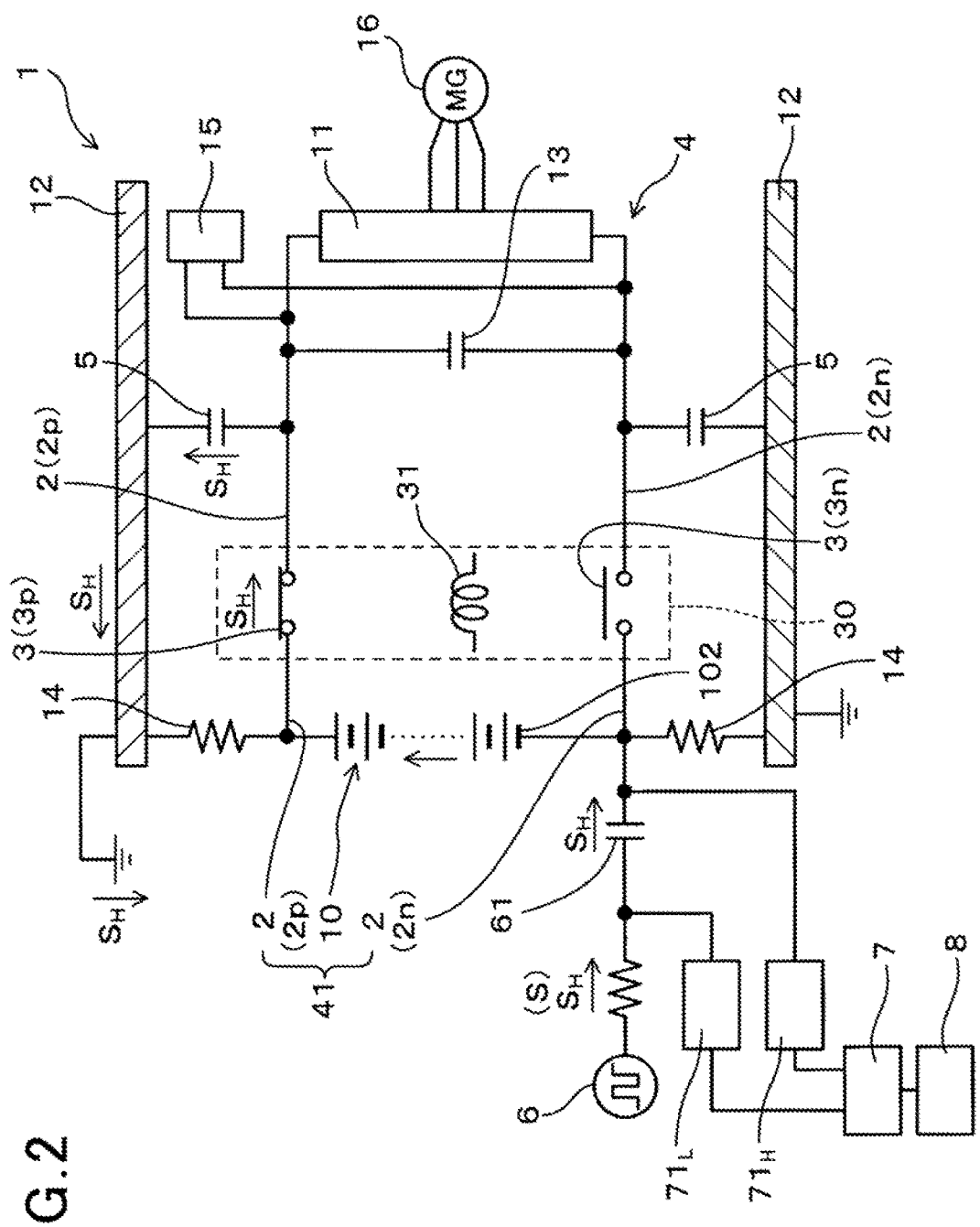
FIG. 2 is a circuit diagram illustrating the failure inspection system in a condition in which the high-frequency AC signal is being generated when there is a short-circuit failure of a switch, without occurrence of a leakage current failure, according to the first embodiment.
Figure 7:
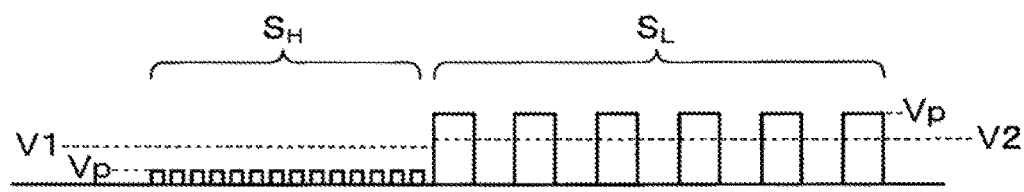
FIG. 7 is a waveform diagram illustrating the AC signal voltage in the case in which there is a short-circuit failure, while no leakage current failure has occurred, according to the first embodiment.

The judgement section 8 is connected to the measurement section 7, and serves to detect whether or not there is a short-circuit failure of a switch 3 or a leakage current failure of the DC power source 10, prior to starting the electrical apparatus 11. In this detection operation, the judgement section 8 first generates the high-frequency AC signal $S_H$ from the signal generating section 6. Assuming that, as shown in FIG. 2, there is a short-circuit failure of the positive-side switch 3p, while there is no leakage current failure, the high-frequency AC signal $S_H$ will flow through the positive-side switch 3p. Since the impedance of each capacitor 5 is low with respect to the high-frequency AC signal $S_H$, the high-frequency AC signal $S_R$ will then flow through a capacitor 5 to ground. As a result, the value of peak voltage Vp of the high-frequency AC signal $S_H$ that is measured by the measurement section 7 will become lowered, as shown in FIG. 7, and will fall below the first threshold V1. As described hereinafter, the peak voltage Vp of the high-frequency AC signal $S_R$ will also fall below the first threshold V1 when a leakage current failure occurs. Hence, if the high-frequency AC signal $S_H$ voltage falls below the first threshold V1, the judgement section 8 cannot specify the type of failure (leakage current failure or short-circuit failure) that has occurred, but judges that one of the two types of failure has occurred.

Figure 3:
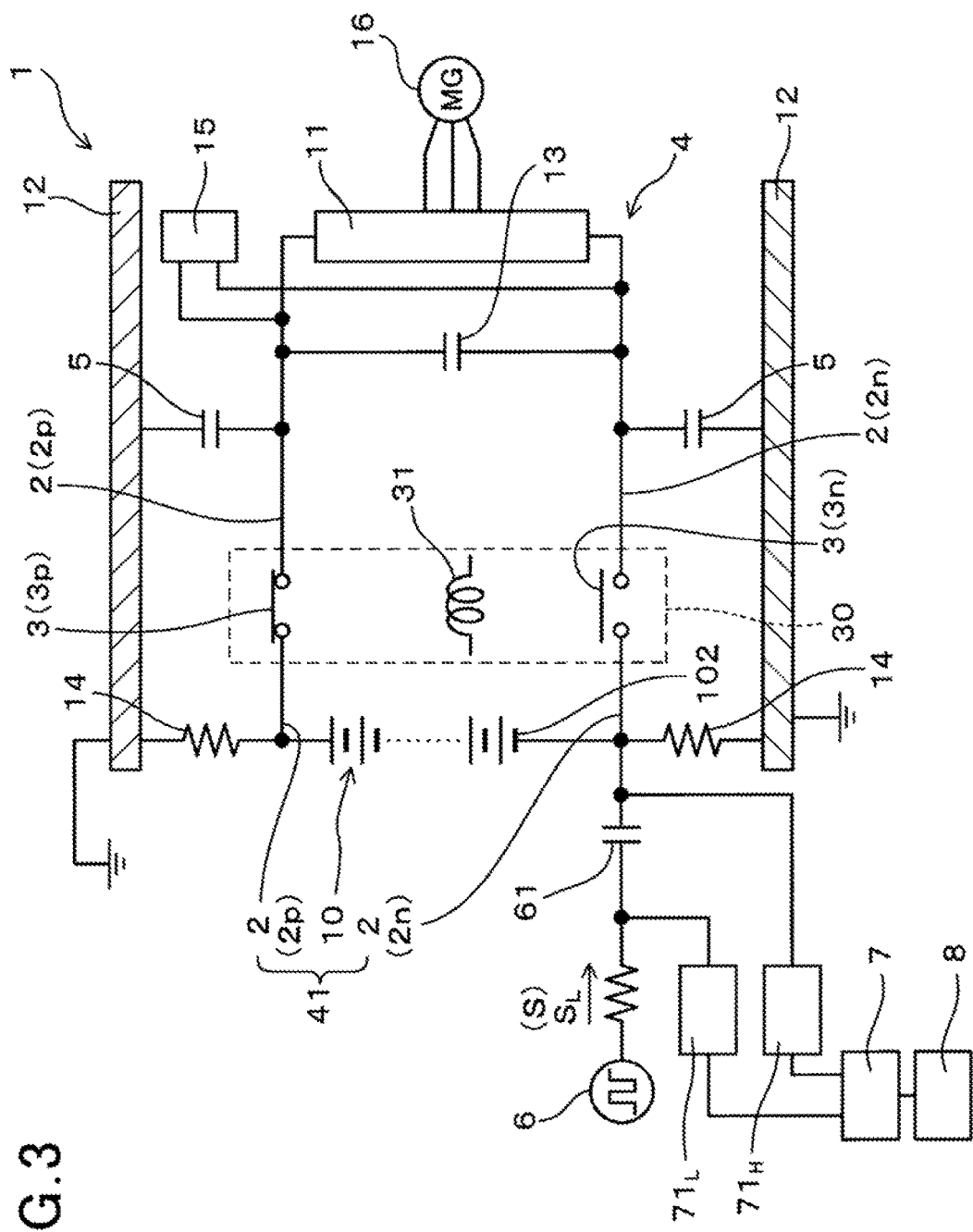
FIG. 3 is a circuit diagram illustrating the failure inspection system in a condition in which a low-frequency AC signal is being generated when there a short-circuit failure of a switch, without occurrence of a leakage current failure, according to the first embodiment.

When it has been judged that there is a failure, as in the example of FIG. 3, the low-frequency AC signal $S_L$ is then generated from the signal generating section 6. Each capacitor 5 presents a high value of impedance to the low-frequency AC signal $S_L$, so that the signal cannot flow through a capacitor 5 to ground. In addition, if there is no leakage current failure, leakage current cannot flow through the resistors 14 to ground. Hence, the peak voltage Vp of the low-frequency AC signal $S_L$, as measured by the measurement section 7, has a high value as shown in FIG. 7, and remains above the second threshold V2. If the peak voltage Vp of the low-frequency AC signal $S_L$ is higher than the second threshold V2, the judgement section 8 judges that there is a short-circuit failure.

FIGS. 2 and 3 show a case in which a short-circuit failure of the positive-side switch 3p has occurred, however the voltage waveform of the AC signal S will be the same when there is a short-circuit failure of the positive-side switch 3n, or when there are short-circuit failures of both of the switches 3p, 3n.

Figure 4:
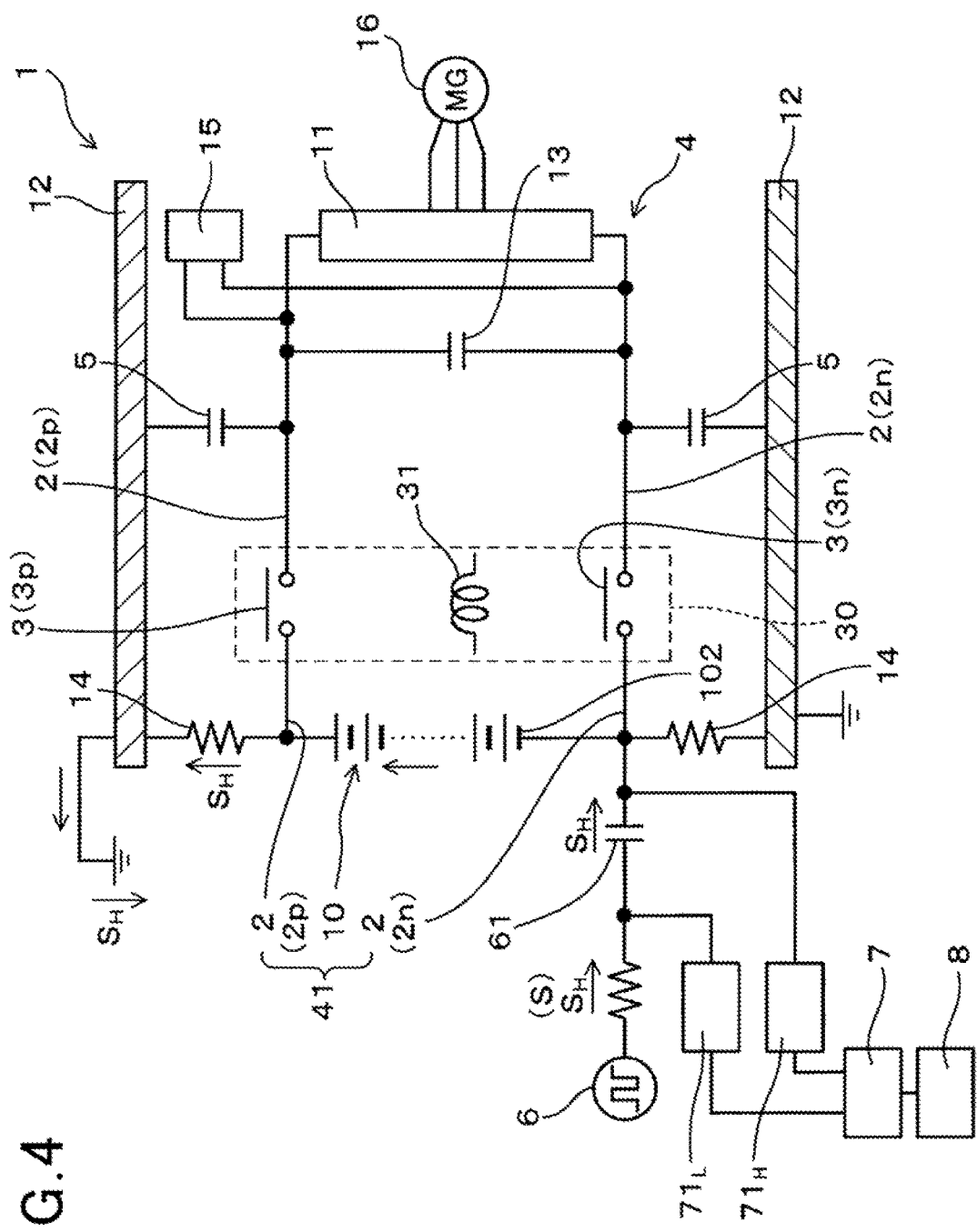
FIG. 4 is a circuit diagram illustrating the failure inspection system in a condition in which the high-frequency AC signal is being generated when there is a leakage current failure, without occurrence of a short-circuit failure of a switch, according to the first embodiment.
Figure 8:
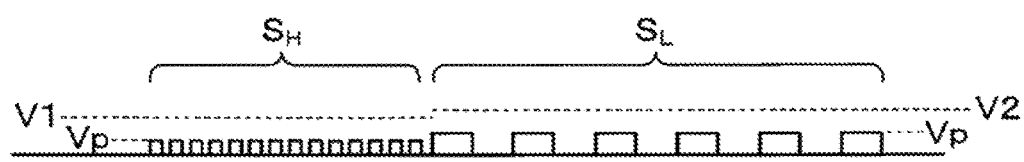
FIG. 8 is a waveform diagram illustrating the AC signal voltage in the case in which there is a leakage current failure, while no short-circuit failure has occurred, according to the first embodiment.

If there is no short-circuit failure of either of the switches 3p, 3n while there is a leakage current failure of the DC power source 10, as in the example of FIG. 4, then when the high-frequency AC signal $S_H$ is generated from the signal generating section 6, the high-frequency AC signal $S_H$ will flow through the resistors 14 to ground. As a result, as shown in FIG. 8, the peak voltage Vp of the high-frequency AC signal $S_H$, measured by the measurement section 7, will become lowered and will fall below the first threshold V1.

Figure 5:
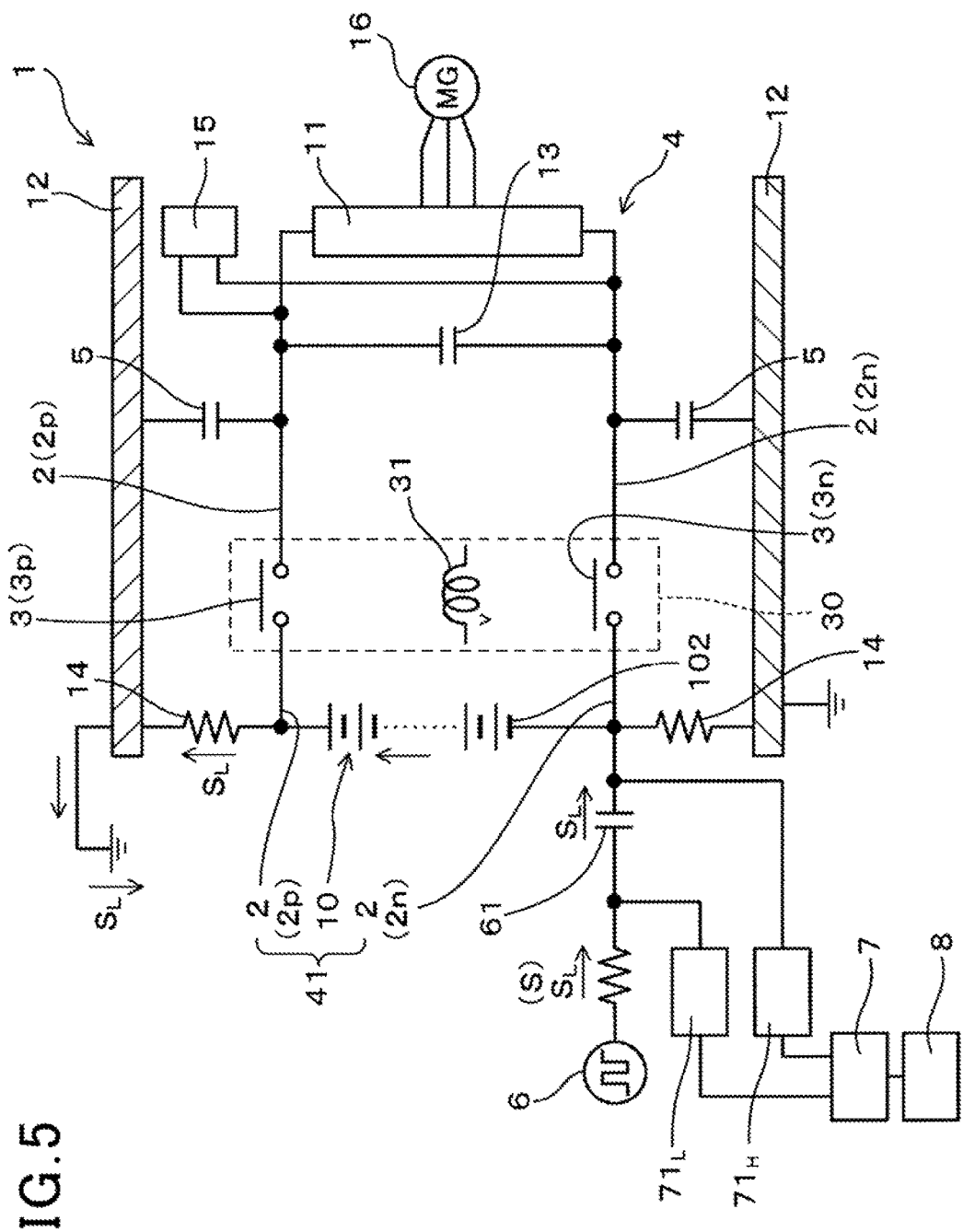
FIG. 5 is a circuit diagram illustrating the failure inspection system in a condition in which the low-frequency AC signal is being generated when there is a leakage current failure, without occurrence of a short-circuit failure of a switch, according to the first embodiment.

If the peak voltage Vp of the high-frequency AC signal $S_H$ is below the first threshold V1, the judgement section 8 judges that one of the two types of failure has occurred (i.e., leakage current failure or short-circuit failure), although the type of failure that has occurred cannot be specified as described above. Hence, as shown in FIG. 5, the low-frequency AC signal $S_L$ is generated from the signal generating section 6. The impedance of the resistors 14 is independent of frequency, so that the low-frequency AC signal $S_L$ will pass through the resistors 14 to ground, similarly to the high-frequency AC signal $S_H$. Hence, as shown in FIG. 8, the peak voltage Vp of the low-frequency AC signal $S_L$, measured by the measurement section 7, will become lowered and will be the second threshold V2 or less. If the peak voltage Vp of the low-frequency AC signal $S_L$ is not more than the second threshold V2, the judgement section 8 judges that there is a leakage current failure.

Figure 6:
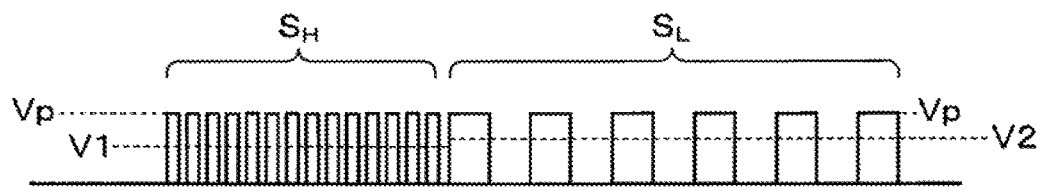
FIG. 6 is a waveform diagram illustrating the AC signal voltage in the case in which neither a short-circuit failure nor a leakage current failure has occurred, according to the first embodiment.

If there is neither a leakage current failure nor a short-circuit failure, as in the example of FIG. 1, then the high-frequency AC signal $S_H$ generated by the signal generating section 6 does not pass through any of the switches 3 or the resistors 14. As a result, as shown in FIG. 6, the peak voltage Vp of the high-frequency AC signal $S_H$, as measured by the measurement section 7, will have a high value which exceeds the first threshold V1. In that case, the judgement section 8 judges that there is no leakage current failure or short-circuit failure.

Figure 9:
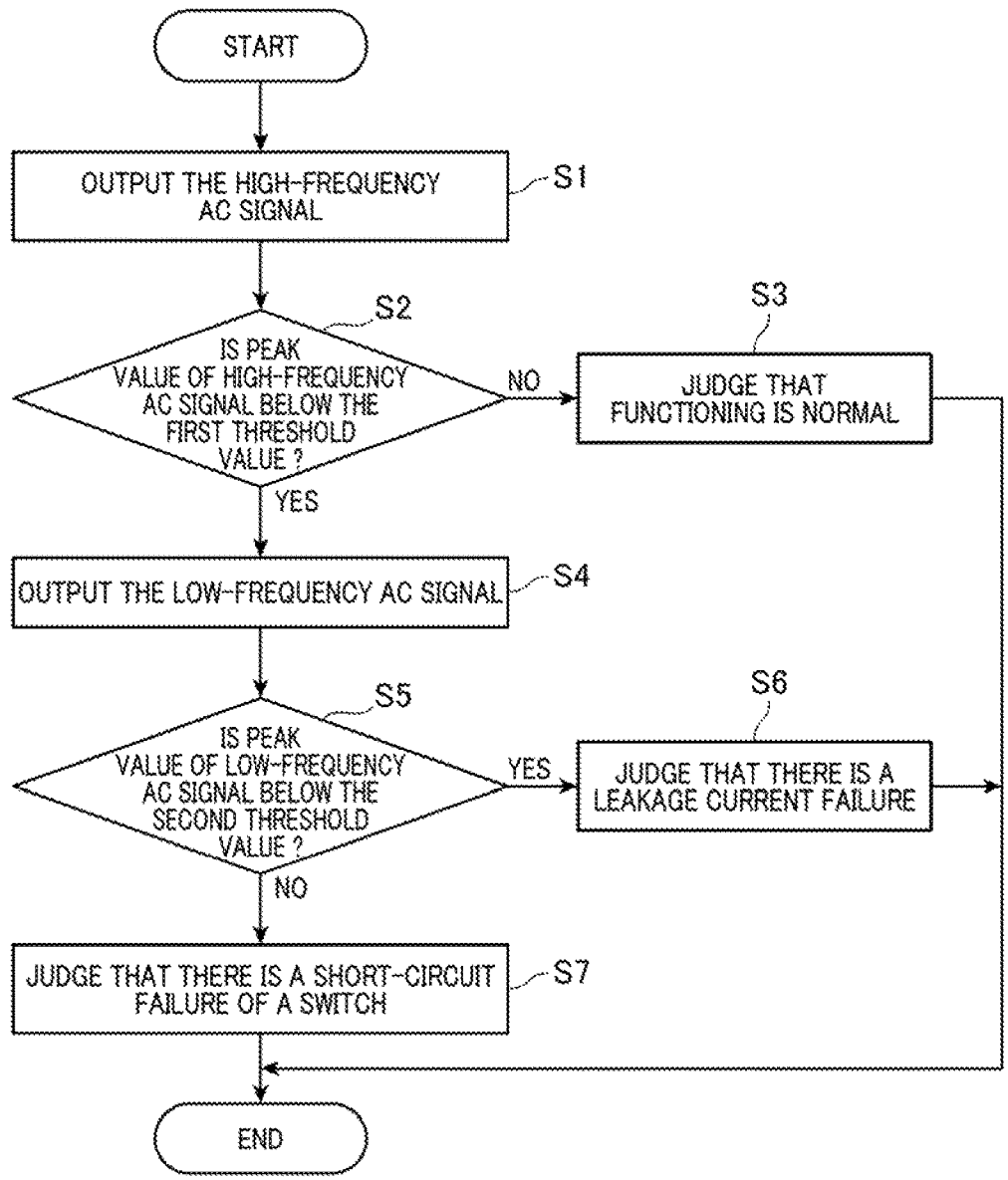
FIG. 9 is a flow diagram illustrating operation of the failure inspection system, according to the first embodiment.

A flow diagram of the operation of the failure inspection system 1 will now be described. As shown in FIG. 9, the failure inspection system 1 firstly generates the high-frequency AC signal $S_H$ from the signal generating section 6 (step S1), before starting the electrical apparatus 11 (see FIG. 1). Then, operation proceeds to step S2 in which a decision is made as to whether the peak voltage Vp of the high-frequency AC signal $S_H$ is lower than the first threshold V1. If there is a NO decision, i.e., the peak voltage Vp exceeds the first threshold V1 (see FIG. 6), operation proceeds to step S3 in which it is judged that there is neither a leakage current failure nor a short-circuit failure.

If there is a YES decision in step S2, i.e. if it is judged that the peak voltage Vp of the high-frequency AC signal $S_H$ is below the first threshold V1, (see FIG. 7, 8) and either one of the two types of failure has occurred, operation proceeds to step S4 in which the low-frequency AC signal $S_L$ is generated. Then, operation proceeds to step S5 in which a decision is made as to whether the peak voltage Vp of the low-frequency AC signal $S_L$ is not more than the second threshold V2. If there is a YES decision, i.e. if it is judged that the peak voltage Vp of the low-frequency AC signal $S_L$ is not more than the second threshold V2 (see FIG. 8), operation proceeds to step S6 in which it is judged that there is a leakage current failure. If there is a NO decision in step S5, i.e. if it is judged that the peak voltage Vp of the low-frequency AC signal $S_L$ exceeds the second threshold V2 (see FIG. 7), operation proceeds to step S7 in which it is judged that there is a short-circuit failure.

With this embodiment, if operation proceeds to step S3 in which it is judged that neither of the two types of failure is occurring, the electrical apparatus 11 (see FIG. 1) is then started. Specifically, the smoothing capacitor 13 is first charged by using the charging apparatus 15, then the switches 3p, 3n are turned on. Then, the DC power of the DC power source 10 is supplied via the switches 3p, 3n to the electrical apparatus 11.

Furthermore, with this embodiment, if it is judged that a leakage current failure or a short-circuit failure is occurring (step S7 or S8), the electrical apparatus 11 is not started. That is, the switches 3p, 3n are ensured to be controlled so as not to be turned on.

Advantageous effects of this embodiment are as follows. The signal generating section 6 is configured for generating two types of AC signal S, i.e. the high-frequency AC signal $S_H$ and the low-frequency AC signal $S_L$. As a result, it is possible for the judgement section 8 to specify which of a leakage current failure and a short-circuit failure has occurred. That is, as shown in FIGS. 7 and 8, if the peak voltage Vp of the high-frequency AC signal $S_H$ is not more than the first threshold V1, it is judged that one of these two types of failure is occurring, although the specific type of failure cannot be determined. If it is judged that a failure has occurred, the low-frequency AC signal $S_L$ is then used to specify the particular type of failure as a leakage current failure or as a short-circuit failure (see FIGS. 7 and 8).

Specifically, as shown in FIG. 3, when there is a short-circuit failure of a switch, the low-frequency AC signal $S_L$ does not flow through the capacitors 5 to ground, due to the high impedance presented to the low-frequency AC signal $S_L$ by the capacitors 5. Thus, the peak voltage Vp of the low-frequency AC signal $S_L$ becomes high, and exceeds the second threshold V2 (see FIG. 7). Furthermore, when a leakage current failure occurs, as shown in FIG. 5, the low-frequency AC signal $S_L$ flows through the resistors 14 to ground. The peak voltage Vp of the low-frequency AC signal $S_L$ thereby becomes low, and falls below the second threshold V2 (see FIG. 8). Hence, by judging whether the peak voltage Vp of the low-frequency AC signal $S_L$ is not more than the second threshold V2, a decision can be made as to whether the failure that has occurred is a short-circuit failure or a leakage current failure.

Furthermore, when performing failure inspection with this embodiment, as shown in FIG. 9, the high-frequency AC signal $S_H$ is first generated (step S1). As a result, a decision can quickly be made as to whether or not a failure is occurring. In the event that, for example, the low-frequency AC signal $S_L$ is generated first, a leakage current failure could be detected by using the low-frequency AC signal $S_L$, however, it would not be possible to detect a short-circuit failure of a switch 3. Therefore, it would be necessary to generate the high-frequency AC signal $S_H$ following generation of the low-frequency AC signal $S_L$ to detect whether a short-circuit failure has occurred. This is because the low-frequency AC signal $S_L$ does not flow through the capacitors 5 and thus the peak voltage Vp of the low-frequency AC signal $S_L$ will not become lowered if there is a short-circuit failure.

Thus, in order to judge that none of the failures is occurring, it would be necessary to generate both the high-frequency AC signal $S_H$ and the low-frequency AC signal $S_L$, and therefore, a longer time would be required to reach such a decision. In contrast, the peak voltage Vp of the high-frequency AC signal $S_H$ becomes lowered when there is either a leakage current failure or a short-circuit failure. Hence, with the above embodiment, the high-frequency AC signal $S_H$ is generated first, so that it becomes possible to detect that neither of the two types of failure is occurring, by only confirming the peak voltage Vp of the high-frequency AC signal $S_H$. Thus, the failure inspection can be completed within a short time.

The embodiment described above provides a failure inspection system which uses an AC signal to specify which failure, a leakage current failure or a short-circuit failure, is occurring.

With the signal generating section 6 of the above embodiment, only the high-frequency AC signal $S_H$ and the low-frequency AC signal $S_L$ are generated as the AC signal S. However, the present invention is not limited to this. For example, as with a fourth embodiment described hereinafter, an AC signal S having frequencies other than those of the high-frequency AC signal $S_H$ and the low-frequency AC signal $S_L$ may be generated, for use in detecting failures other than a leakage current failure and a short-circuit failure.

With the above embodiment, values of peak voltage Vp of the AC signals $S_H$ and $S_L$ are measured by the measurement section 7. However, the present invention is not limited to this, but the average value of the AC signals $S_H$ and $S_L$ may be measured. Alternatively, as described hereinafter, the measurement section 7 may measure values of current of the AC signals $S_H$ and $S_L$ (see FIGS. 21 to 24).

Furthermore, the capacitors 5 are made up of specific electronic parts such as ceramic capacitors. However, the present invention is not limited to this, but the capacitors 5 may be made up of parasitic capacitances. For example, the spacing between each of the power lines 2p, 2n and the conductive member 12 may be made small to use the resultant parasitic capacitances therebetween as the capacitors 5.

Furthermore, with the above embodiment, as shown in FIG. 1, the signal generating section 6 and the measurement section 7 are connected to the main circuit first section 41 at a position (connection point A) that is at the same potential as the negative terminal 102 of the DC power source 10. However, the present invention is not limited to this. Specifically, the connection may be made at a position (connection point B) that is at the same potential as the positive terminal 101 of the DC power source 10. Alternatively, the connection may be made at a position within the DC power source 10.

Second Embodiment

With the following embodiments, reference numerals used in the drawings which are identical to reference numerals of the first embodiment indicate the same constituent elements as for the first embodiment, unless otherwise indicated.

Figure 10:
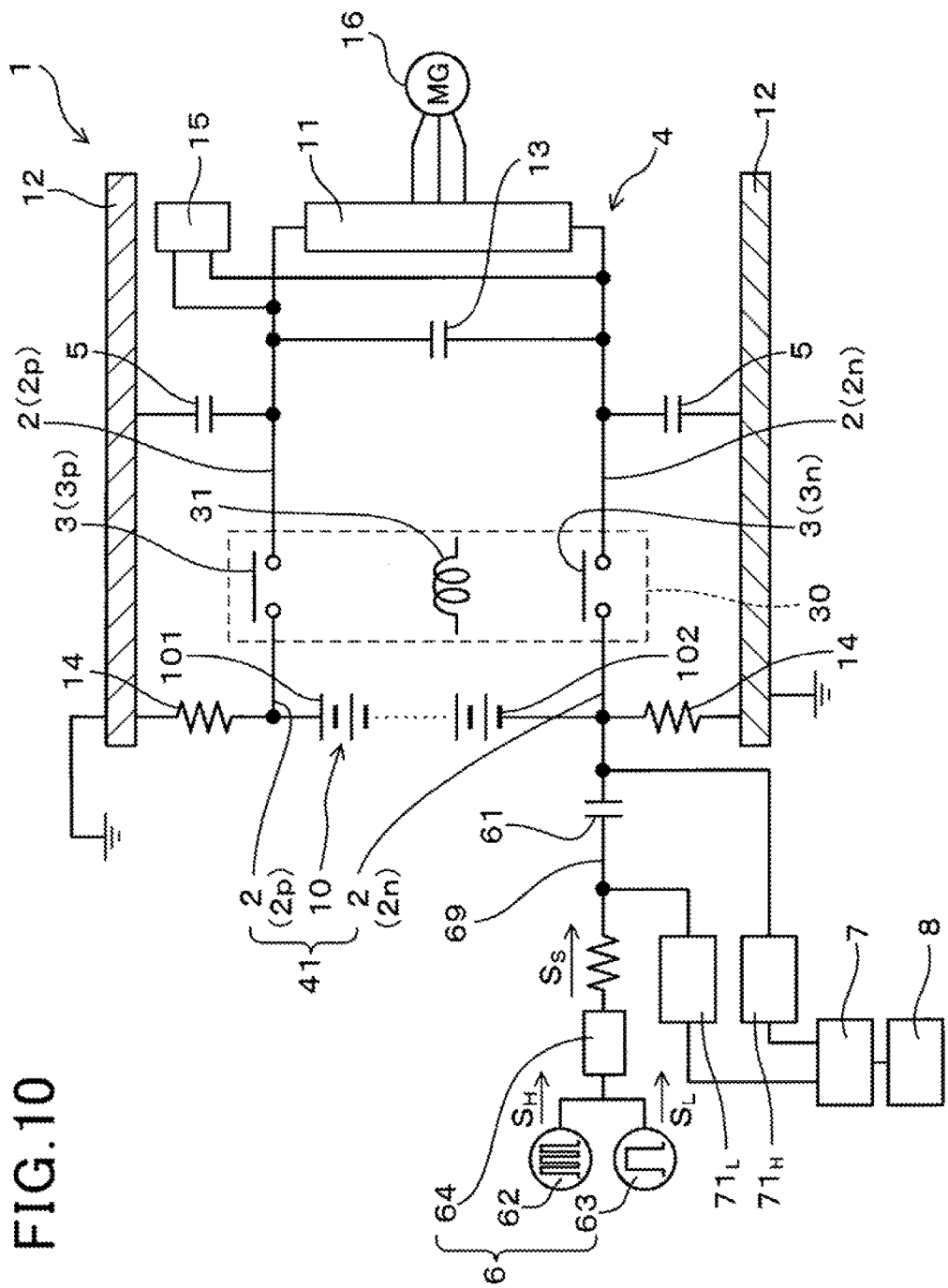
FIG. 10 is a circuit diagram illustrating a failure inspection system, according to a second embodiment of the present invention.

In a second embodiment, the waveforms of the AC signal S generated by the signal generating section 6 are changed from those of the first embodiment. As shown in FIG. 10, the signal generating section 6 of the present embodiment includes a high-frequency generating section 62, a low-frequency generating section 63 and an adding circuit 64. The high-frequency generating section 62 generates the high-frequency AC signal $S_H$, the low-frequency generating section 63 generates the low-frequency AC signal $S_L$. The adding circuit 64 adds together the high-frequency AC signal $S_H$ and the low-frequency AC signal $S_L$ to generate a combined AC signal $S_S$.

The high-frequency filter $71_H$ and the low-frequency filter $71_L$ are installed between the measurement section 7 and the signal generating section 6, similarly to the first embodiment, with the high-frequency filter $71_H$ extracting the high-frequency AC signal $S_H$ from the combined AC signal $S_S$, and the low-frequency filter $71_L$ similarly extracting the low-frequency AC signal $S_L$. The measurement section 7 measures the respective peak voltage Vp of the high-frequency AC signal $S_H$ extracted by the high-frequency filter $71_H$ and the low-frequency AC signal $S_L$ extracted by the low-frequency filter $71_L$.

Figure 11:
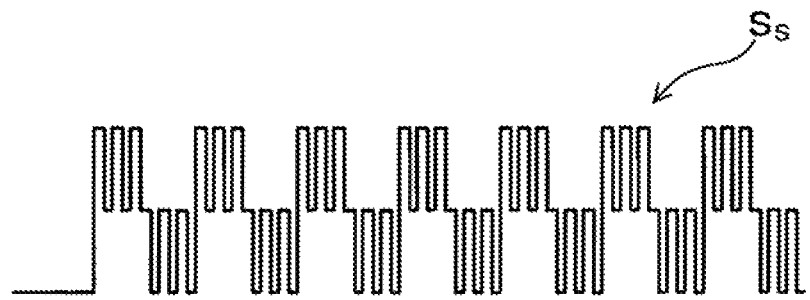
FIG. 11 is a waveform diagram illustrating a combined AC signal voltage in the case in which neither a short-circuit failure nor a leakage current failure has occurred, according to the second embodiment.
Figure 12:
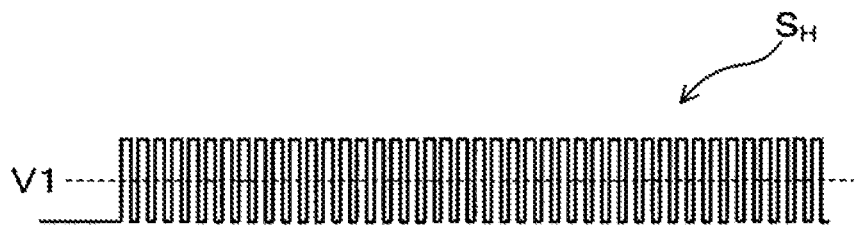
FIG. 12 is a waveform diagram illustrating a high-frequency AC signal extracted from the combined AC signal of FIG. 11.
Figure 13:
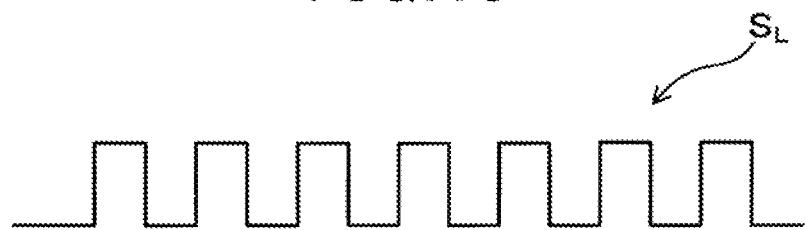
FIG. 13 is a waveform diagram illustrating a low-frequency AC signal extracted from the combined AC signal of FIG. 11.

As shown in FIG. 11, the combined AC signal $S_S$ has a waveform that is a combination of the waveforms of the high-frequency AC signal $S_H$ (see FIG. 12) and low-frequency AC signal $S_L$ (see FIG. 13). The high-frequency AC signal $S_H$ shown in FIG. 12 is extracted from the combined AC signal $S_S$ by the high-frequency filter $71_H$, and the low-frequency AC signal $S_L$ shown in FIG. 13 is extracted from the combined AC signal $S_S$ by the low-frequency filter $71_L$.

Figure 14:
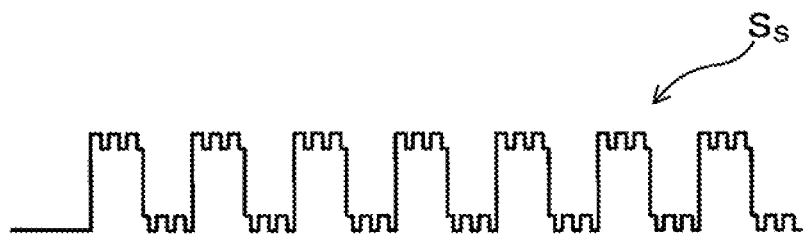
FIG. 14 is a waveform diagram illustrating the combined AC signal voltage in the case in which there is a short-circuit failure of a switch, while no leakage current failure has occurred, according to the second embodiment.
Figure 15:
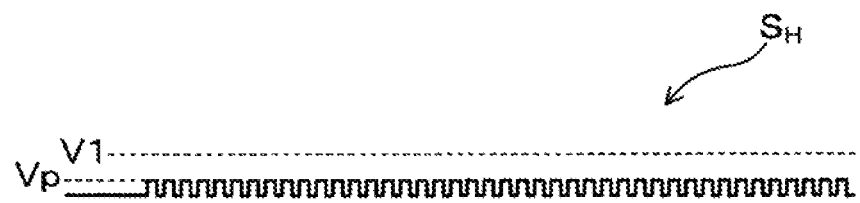
FIG. 15 is a waveform diagram illustrating a high-frequency AC signal extracted from the combined AC signal of FIG. 14.
Figure 16:
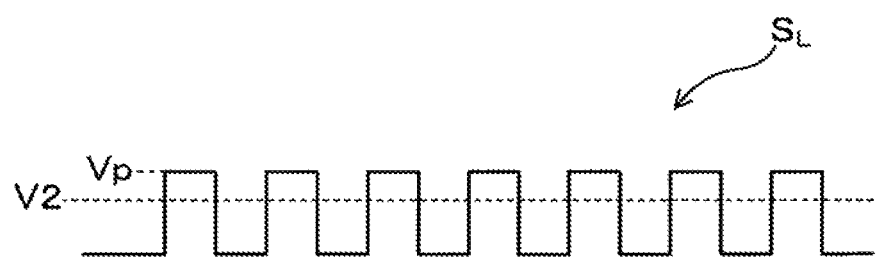
FIG. 16 is a waveform diagram illustrating a low-frequency AC signal extracted from the combined AC signal of FIG. 14.

If a short-circuit failure occurs in a switch 3, the high-frequency AC signal $S_H$ passes through the switch 3 concerned and through a capacitor 5 and flows to ground. As a result, as shown in FIG. 15, the peak voltage Vp of the high-frequency AC signal $S_H$ will become low, and falls below the first threshold V1. If there is no leakage current failure, the low-frequency AC signal $S_L$ will not flow through the resistors 14 to ground. As a result, as shown in FIG. 16, the peak voltage Vp of the low-frequency AC signal $S_L$ will be high, and will exceed the second threshold V2. In that case, the waveform of the combined AC signal $S_S$ that is a combination of the AC signals $S_H$ and $S_L$ will be as shown in FIG. 14. When the peak voltage Vp of the high-frequency AC signal $S_H$ is not more than the first threshold V, as shown in FIG. 15, the judgement section 8 of the present embodiment judges that one of the two types of failure (short-circuit failure and leakage current failure) is occurring. The peak voltage Vp of the low-frequency AC signal $S_L$ is then confirmed, and if that peak voltage Vp exceeds the second threshold V2 as shown in FIG. 16, the judgement section 8 determines that the failure is a short-circuit failure.

Figure 17:
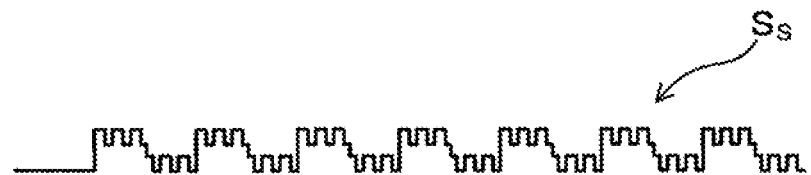
FIG. 17 is a waveform diagram illustrating the combined AC signal voltage in the case in which there is a leakage current failure, while no short-circuit failure of a switch has occurred, according to the second embodiment.
Figure 18:
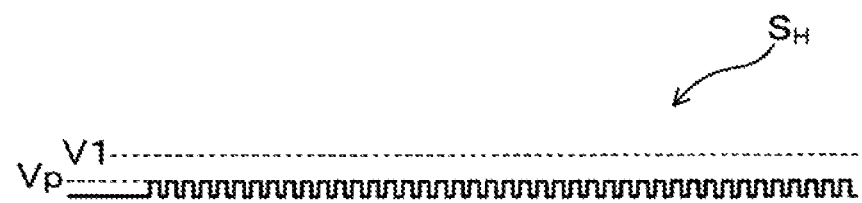
FIG. 18 is a waveform diagram illustrating a high-frequency AC signal extracted from the combined AC signal of FIG. 17.
Figure 19:
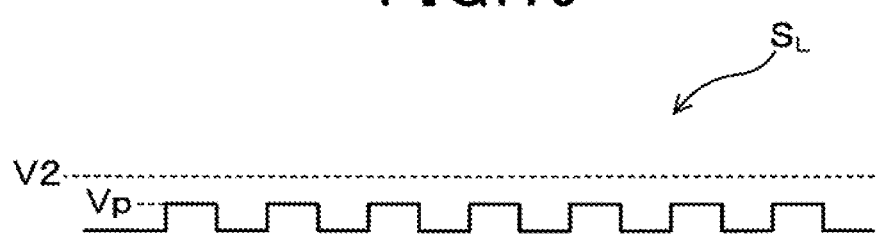
FIG. 19 is a waveform diagram illustrating a low-frequency AC signal extracted from the combined AC signal of FIG. 17.

If a leakage current failure occurs, the high-frequency AC signal $S_H$ will pass through the resistors 14 and flow to ground. As a result, as shown in FIG. 18, the peak voltage Vp of the high-frequency AC signal $S_H$ will fall below the first threshold V1. Moreover, when a leakage current failure occurs, the low-frequency AC signal $S_L$ also passes through the resistors 14 and flows to ground. Hence, as shown in FIG. 19, the peak voltage Vp of the low-frequency AC signal $S_L$ will fall below the second threshold V2. In that case, the waveform of the combined AC signal $S_S$ that is a combination of the AC signals $S_H$ and $S_L$ will be as shown in FIG. 17. When the peak voltage Vp of the high-frequency AC signal $S_H$ is not more than the first threshold V1, as shown in FIG. 18, the judgement section 8 of the present embodiment judges that one of the two types of failure (leakage current failure and short-circuit failure) is occurring. The peak voltage Vp of the low-frequency AC signal $S_L$ is then confirmed, and if the peak voltage Vp is found to be not more than the second threshold V2, as shown in FIG. 19, the judgement section 8 determines that there is a leakage current failure.

Figure 20:
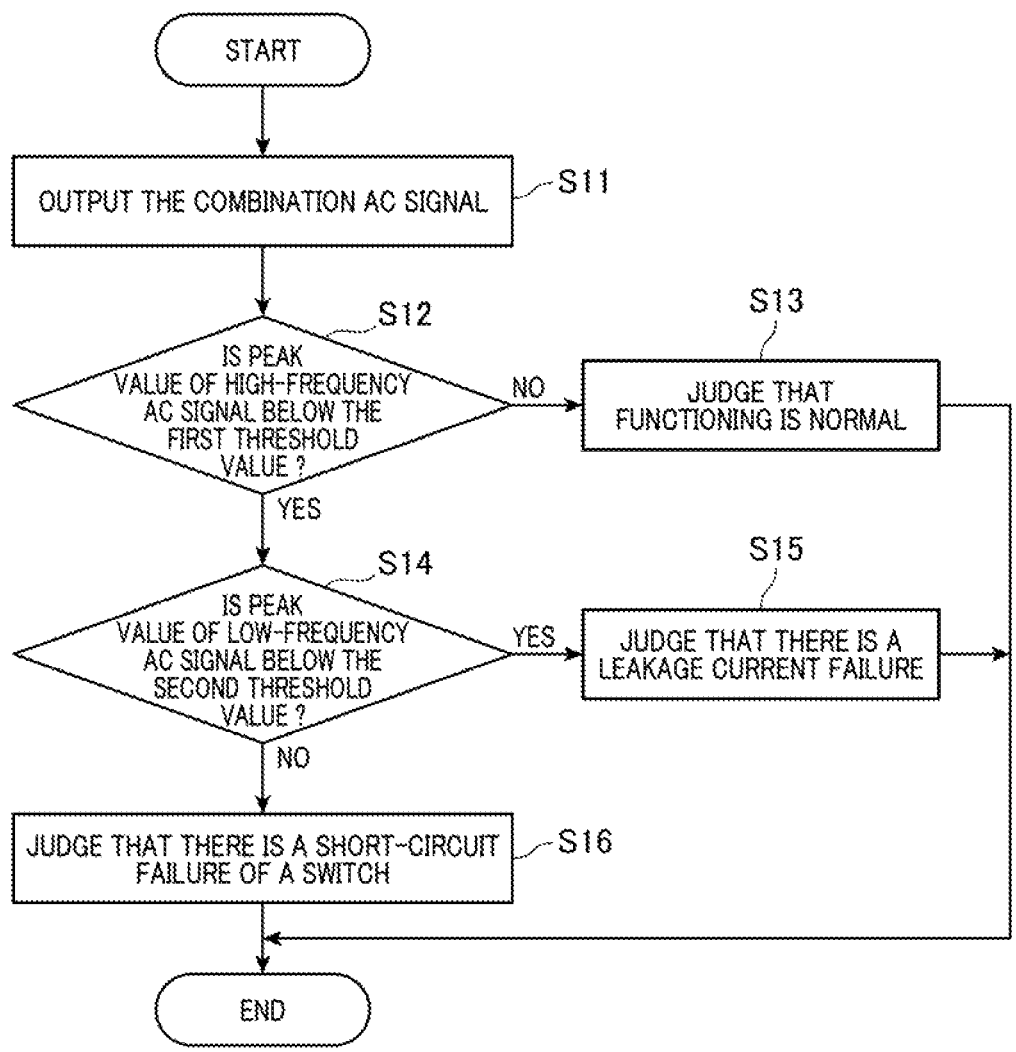
FIG. 20 is a flow diagram illustrating operation of the failure inspection system, according to the second embodiment.

Referring to FIG. 20, a flow diagram of the operation of the failure inspection system 1 of the present embodiment will be described. Firstly, the failure inspection system 1 causes the signal generating section 6 to generate the combined AC signal $S_S$ (step 11). Then, operation proceeds to step S12 in which a decision is made as to whether the peak voltage Vp of the high-frequency AC signal $S_H$ is not more than the first threshold V1. If there is a NO decision, operation proceeds to step S13 in which it is determined that neither of the two types of failure is occurring.

However, if there is a YES decision in step S12, i.e. the peak voltage Vp of the high-frequency AC signal $S_H$ is not more than the first threshold V1 (see FIGS. 15 and 18) so that it is judged that one of the two types of failure is occurring, operation proceeds to step S14. In step S14, a decision is made as to whether the peak voltage Vp of the low-frequency AC signal $S_L$ is not more than the second threshold V2. If there is a YES decision (see FIG. 19), operation proceeds to step S15 in which it is determined that there is a leakage current failure. However, if there is a NO decision in step S14 (see FIG. 16), operation proceeds to step S16 in which it is determined that there is a short-circuit failure of a switch 3.

Advantageous effects of the present embodiment are as follows. A combined AC signal $S_S$ is generated, which is a combination of a high-frequency AC signal $S_H$ and a low-frequency AC signal $S_L$. Therefore, the respective peak voltage Vp values of the high-frequency AC signal $S_H$ and the low-frequency AC signal $S_L$ can be measured concurrently. Hence, if the peak voltage Vp of the high-frequency AC signal $S_H$ is not more than the first threshold V1 (see step S12 of FIG. 20), so that it is judged that there is a failure, a decision can then be made as to whether peak voltage Vp of the low-frequency AC signal $S_L$ is not more than the second threshold V2, without requiring to generate the low-frequency AC signal $S_L$ separately (see step S14). Hence, whether the failure is a leakage current failure or a short-circuit failure can be specified within a short period of time.

In other respects, the configuration and advantageous effects of the present embodiment are similar to those of the first embodiment.

Third Embodiment

Figure 21:
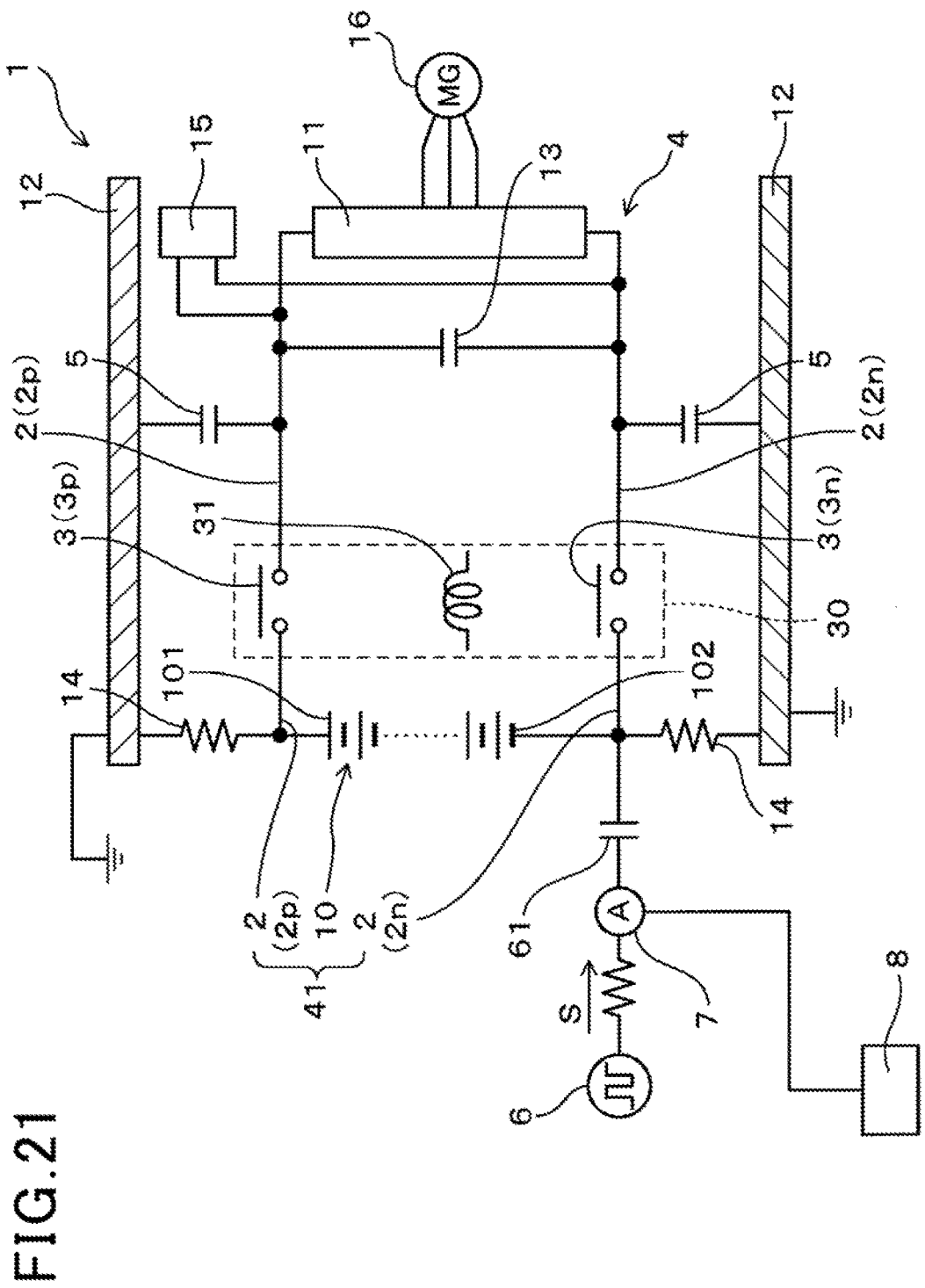
FIG. 21 is a circuit diagram illustrating a failure inspection system, according to a third embodiment of the present invention.

In a third embodiment, the configurations of the measurement section 7 and the judgement section 8 are changed from those of the first embodiment. As shown in FIG. 21, the measurement section 7 of the present embodiment measures peak values Ap of current of the AC signal S, while the judgement section 8 uses the measured peak values of current Ap to perform failure detection.

Figure 23:
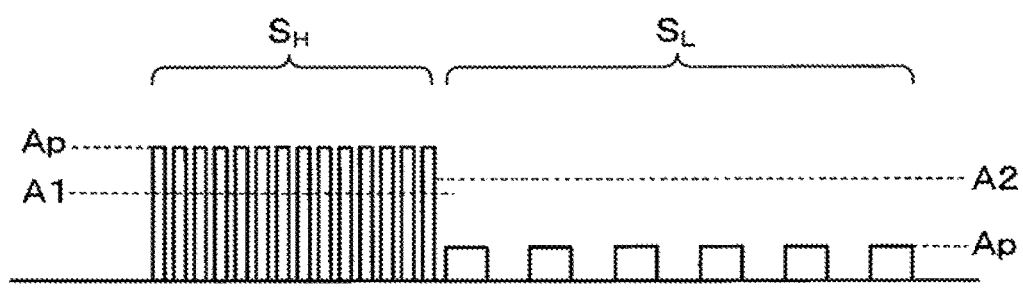
FIG. 23 is a waveform diagram illustrating the AC signal current in the case in which there is a short-circuit failure in a switch, while no leakage current failure has occurred, according to the third embodiment.

In the failure detection operation of the present embodiment, the high-frequency AC signal $S_H$ is first generated, similarly to the first embodiment. If there is a short-circuit failure of a switch 3, the high-frequency AC signal $S_H$ will pass through that switch 3 and through a capacitor 5 and flow to ground. Hence, as shown in FIG. 23, the peak current Ap of the high-frequency AC signal $S_H$, measured by the measurement section 7, will be high, and will be a first threshold A1 or more. In that case, the judgement section 8 will judge that one of two types of failure (short-circuit failure and leakage current failure) is occurring. The judgement section 8 then generates the low-frequency AC signal $S_L$. Since a high impedance is presented to the low-frequency AC signal $S_L$ by the capacitors 5, the low-frequency AC signal $S_L$ does not substantially pass through a capacitor 5 and so does not flow to ground. Hence, the peak current Ap of the low-frequency AC signal $S_L$ will be low, and will become less than the second threshold A2, as shown in FIG. 23. In that case, the judgement section 8 judges that there is a short-circuit failure.

Figure 24:
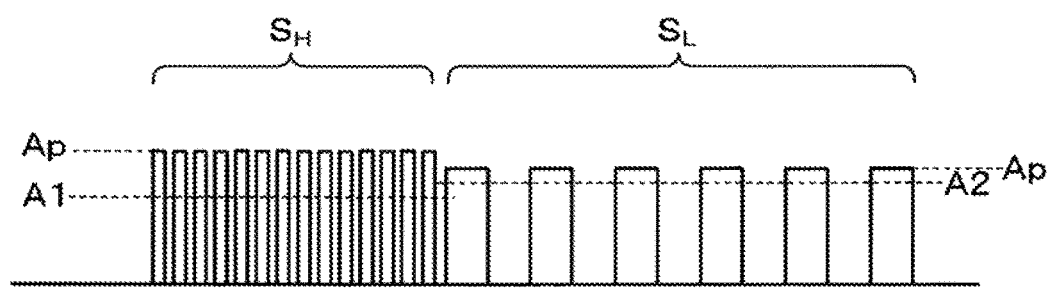
FIG. 24 is a waveform diagram illustrating the AC signal current in the case in which there is a leakage current failure, while no short-circuit failure in a switch has occurred, according to the third embodiment.

If a leakage current failure occurs, the high-frequency AC signal $S_H$ will pass through the resistors 14 and flow to ground. Hence, as shown in FIG. 24, the peak current Ap of the high-frequency AC signal $S_H$ as measured by the measurement section 7 will be high and will be the first threshold A1 or more. In that case, the judgement section 8 judges that either one of the two types of failure (short-circuit failure and leakage current failure) is occurring, and then generates the low-frequency AC signal $S_L$. Since the impedance of the resistors 14 is independent of frequency, the low-frequency AC signal $S_L$ will pass through the resistors 14 as does the high-frequency AC signal $S_H$, and will flow to ground. Hence, as shown in FIG. 24, the peak current Ap of the low-frequency AC signal $S_L$ as measured by the measurement section 7 will be high and will be the second threshold A2 or more. In that case, the judgement section 8 judges that there is a leakage current failure.

Figure 22:
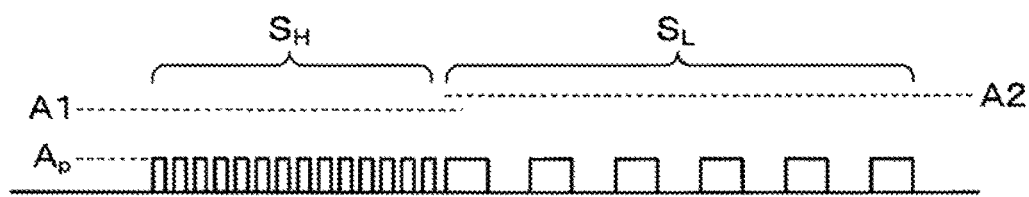
FIG. 22 is a waveform diagram illustrating an AC signal current in the case in which neither a short-circuit failure nor a leakage current failure has occurred, according to the third embodiment.

If neither of the failures occurs, the high-frequency AC signal $S_H$ will not pass through a switch 3 or through a resistor 14, so that, as shown in FIG. 22, the peak current Ap will have a low value. If the peak current Ap of the high-frequency AC signal $S_H$ is not more than the first threshold A1, the judgement section 8 determines that neither of the failures is occurring.

In other respects, the configuration and effects of the present embodiment are similar to those of the first embodiment.

Fourth Embodiment

Figure 25:
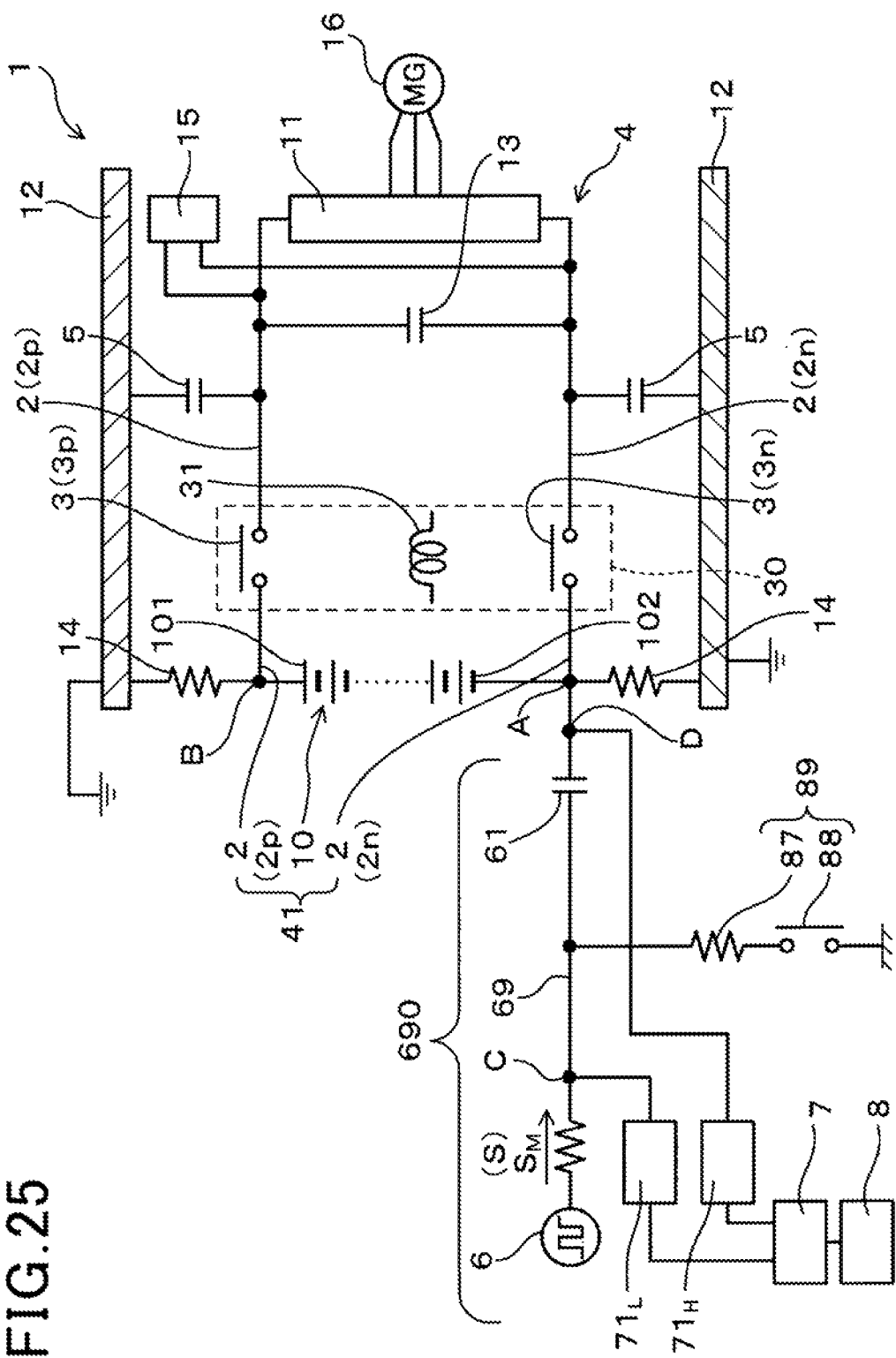
FIG. 25 is a circuit diagram illustrating a failure inspection system, according to a fourth embodiment of the present invention.

In a fourth embodiment, a failure detection circuit 690 formed by the signal generating section 6 and the measurement section 7 is ensured to be confirmed as to whether there is a failure in the circuit 690. As shown in FIG. 25, similar to the first embodiment, the signal generating section 6 of the present embodiment is connected, via the signal line 69, to the main circuit first section 4. A low-frequency filter $71_L$ is connected to a connection point C of the signal line 69 at a position relatively close to the signal generating section 6. A high-frequency filter $71_H$ is connected to a connection point D of the signal line 69 at a position which is farther from the signal generating section 6 than is the connection point C. The measurement capacitor 61 is connected between the connection points C and D.

The signal generating section 6 is configured to generate an intermediate AC signal $S_M$, in a frequency range intermediate between the high-frequency AC signal $S_H$ and the low-frequency AC signal $S_L$. The intermediate AC signal $S_M$ can pass through both the high-frequency filter $71_H$ and the low-frequency filter $71_L$.

In addition, the failure inspection system 1 of the present embodiment includes a forcible grounding circuit 89 formed of a resistor 87 and a forcible grounding switch 88. The forcible grounding circuit 89 is connected between the signal line 69 and ground.

Figure 27:
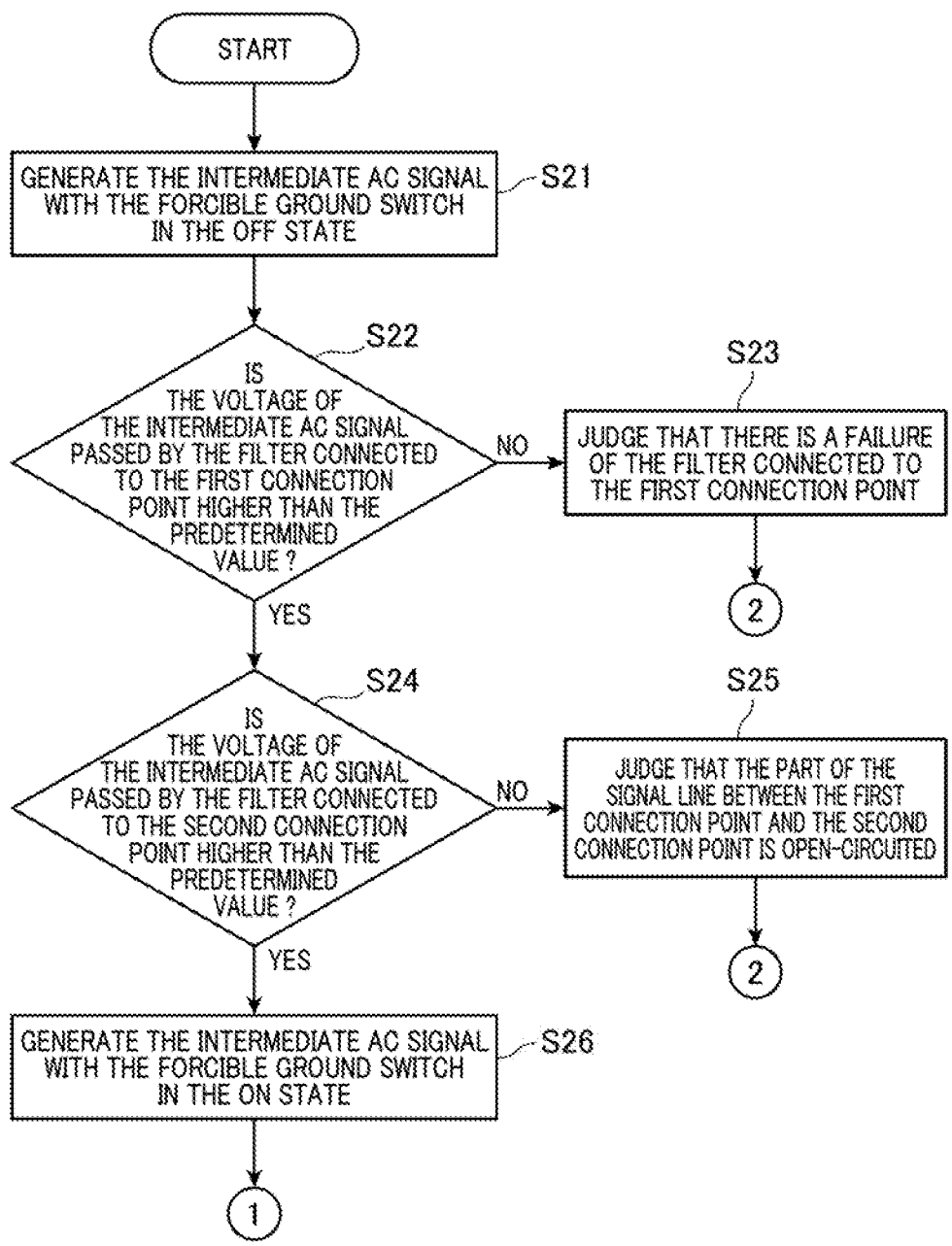
FIGS. 27 and 28 constitute a flow diagram illustrating operation of the failure inspection system, according to the fourth embodiment.

Referring to FIG. 27, a flow diagram of the operation of the present embodiment will be described. Firstly, in the present embodiment, the intermediate AC signal $S_M$ is generated by the signal generating section 6 in a state where the forcible grounding switch 88 is turned off (step S21). Then, operation proceeds to step S22 in which a decision is made as to whether the peak voltage Vp of the intermediate AC signal $S_M$ that has passed through the filter 71 (the low-frequency filter $71_L$) connected to the first connection point C is above a predetermined value. If there is a NO decision, operation proceeds to step S23 in which it is judged that there is a failure of the filter 71 (the low-frequency filter 710 connected to the first connection point C. If there is a YES decision, operation proceeds to step S24.

Figure 30:
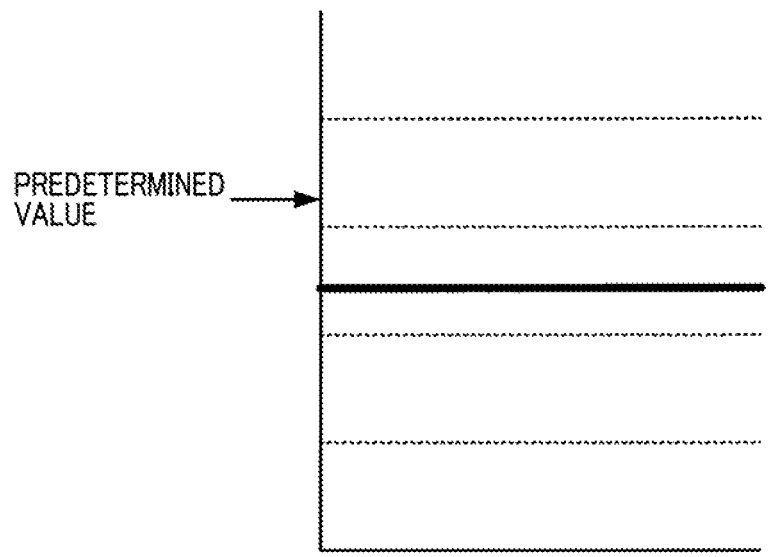
FIG. 30 is a waveform diagram illustrating voltage of the intermediate-frequency signal when passed through the high-pass filter, while the signal line is in an open-circuit condition, according to the fourth embodiment.

In step S24, a decision is made as to whether the voltage of the intermediate AC signal $S_M$ that has passed through the filter 71 (the high-frequency filter $71_H$) connected to the second connection point D is above a predetermined value. If the voltage of the intermediate AC signal $S_M$ is lower than the predetermined value (see the waveform of FIG. 30), i.e. a NO decision, then operation proceeds to step S25. In step S25, it is judged that there is an open-circuit failure in the signal line 69 which connects the first connection point C to the second connection point D, or that there is a failure of the measurement capacitor 61.

Figure 29:
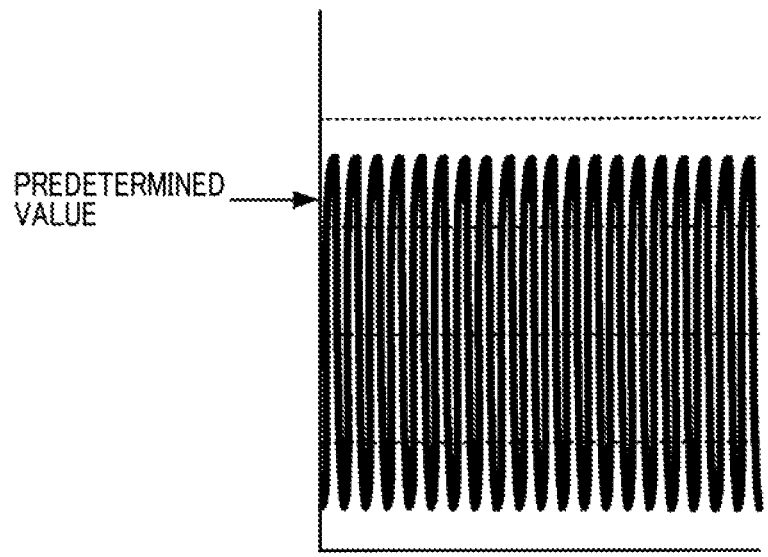
FIG. 29 is a waveform diagram illustrating voltage of an intermediate-frequency signal when passed through a high-pass filter, while a signal line is not in an open-circuit condition, according to the fourth embodiment.

If the voltage of the intermediate AC signal $S_M$ that has passed through the high-frequency filter $71_H$ is above a predetermined value (see FIG. 29), i.e. there is a YES decision in step S24, then operation proceeds to step S26 in which the forcible grounding switch 88 is turned on. The signal line 69 is thereby forcibly connected to ground. In that condition, the intermediate AC signal $S_M$ is generated in step S26.

Figure 26:
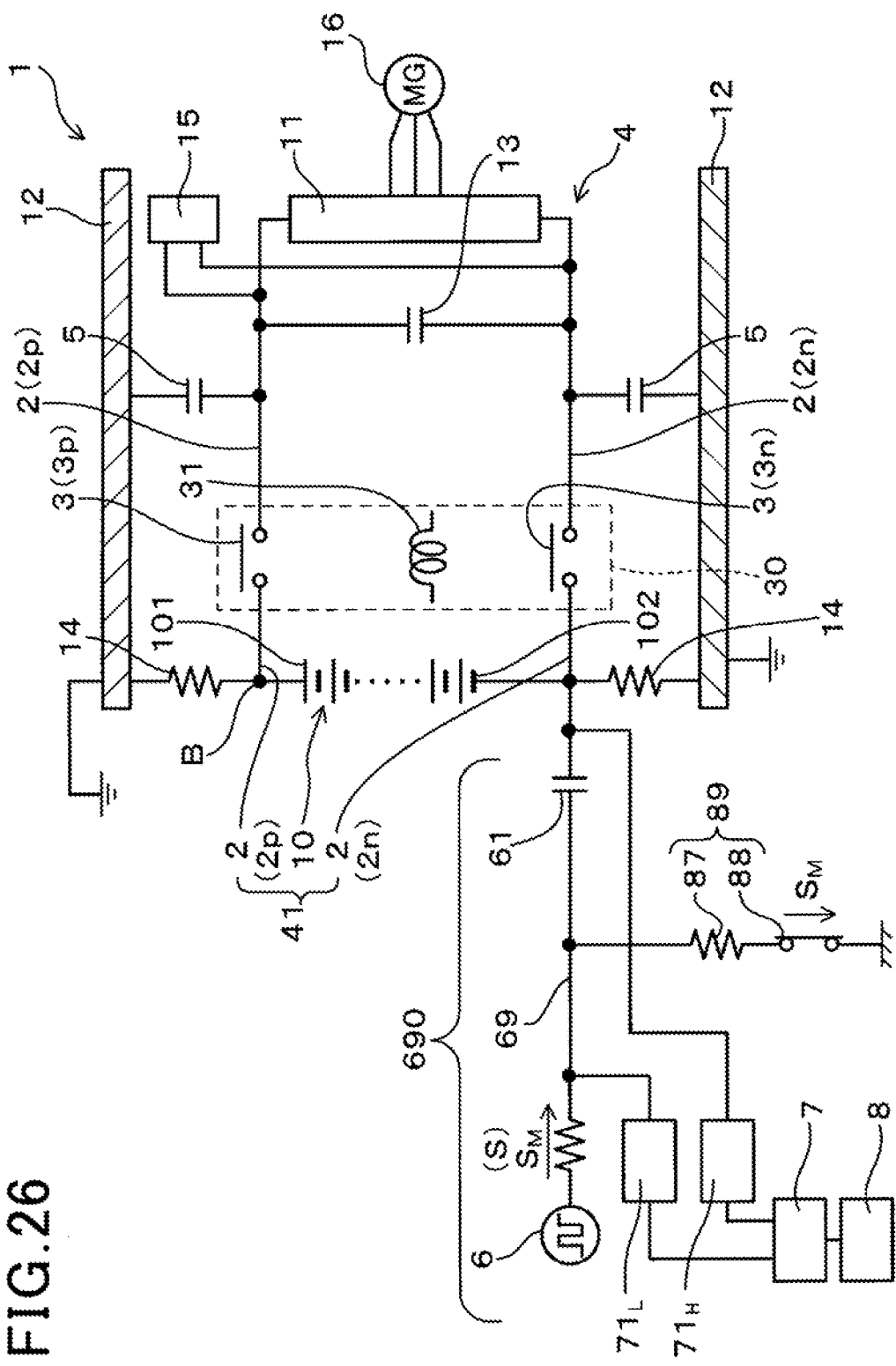
FIG. 26 is a circuit diagram illustrating the failure inspection system in a condition in which a forcible grounding switch is in an on state, according to the fourth embodiment.
Figure 28:
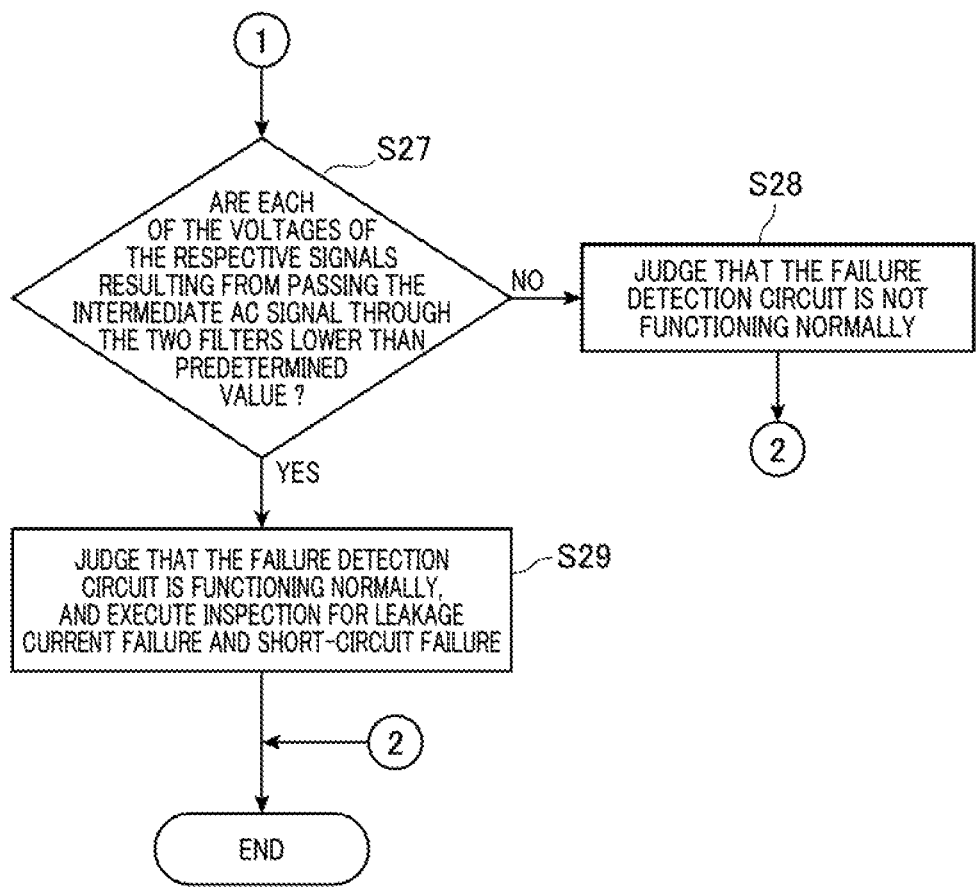

As shown in FIG. 26, when the forcible grounding switch 88 is turned on and the signal line 69 is grounded, the intermediate AC signal $S_M$ flows to ground. As a result, if the failure detection circuit 690 is functioning normally, the voltage values, as measured by the measurement section 7, of the intermediate AC signal $S_M$ that has passed through the two filters $71_H$ and $71_L$ will should become low. With the present embodiment, as shown in FIG. 28, step S27 is executed following step S26. In step S27, a decision is made as to whether the voltages of the intermediate AC signal $S_M$ that has passed through the two filters $71_H$ and $71_L$ are below predetermined values. If there is a NO decision, operation proceeds to step S28 in which it is judged that the failure detection circuit 690 is not functioning normally. If there is a YES decision in step S27, operation proceeds to step S29 in which it is judged that the failure detection circuit 690 is functioning normally. Then, operations for detecting leakage current failure of the DC power source 10 and short-circuit failure of a switch 3 are executed.

Advantageous effects of the present embodiment are as follows. In addition to performing inspection to detect short-circuit failure or leakage current failure, open-circuit failure of the signal line 69 and/or failure of the measurement capacitor 61 can be detected.

In other respects, the configuration and advantageous effects of the present embodiment are similar to those of the first embodiment.

With the above embodiment, the low-frequency filter $71_L$ is connected to the first connection point C, and the high-frequency filter $71_H$ is connected to the second connection point D. However, it would be equally possible to use the opposite arrangement of these connections.

What is claimed is:
1. A failure inspection system comprising:
    a main circuit section including a DC power source, a pair of power lines connecting the DC power source to an electrical apparatus, and a pair of switches connected respectively to corresponding ones of the power lines;
    an electrically conductive member connected to ground and electrically insulated from the power lines;
    a plurality of capacitors respectively coupled between the conductive member and the power lines, each capacitor connected to a power line at a position closer to the electrical apparatus than is the corresponding one of the switches;

a signal generating section electrically connected to a main circuit first section and configured to generate two types of AC signal, including a high-frequency AC signal having a relatively high frequency and a low-frequency AC signal having a frequency lower than that of the high-frequency AC signal, the main circuit first section being a part of the main circuit section and being at a position closer to the DC power source than are the pair of switches;

a measurement section electrically connected to the main circuit first section, and configured to measure respective values of voltage or of current of the two types of AC signal; and a judgment section configured to detect either of a leakage current failure in the DC power source and a short-circuit failure in the switches, based on measured values of AC signal voltage or AC signal current obtained by the measurement section;

wherein the judgment section is configured to judge occurrence of either one of the two types of failure based on a measured value of the high-frequency AC signal obtained by the measurement section, and, when it is judged that either of the two types of failure is occurring, to specify the failure as being a short-circuit failure or a leakage current failure based on a measured value of the low-frequency AC signal obtained by the measurement section.

2. The failure inspection system according to claim 1, wherein:

the signal generating section generates a combined AC signal as a combination of the high-frequency AC signal and the low-frequency AC signal, and between the signal generating section and the measurement section, the failure inspection system further comprises:

a high-frequency filter connected, for extracting the high-frequency AC signal from the combined AC signal, and a low-frequency filter connected in parallel with the high-frequency filter, for extracting the low-frequency AC signal from the combined AC signal.

3. The failure inspection system according to claim 1, wherein:

the signal generating section is connected to the main circuit first section via a signal line, a high-frequency filter that passes the high-frequency AC signal, and a low-frequency filter that passes the low-frequency AC signal are provided between the measurement section and the signal line, one of the two filters, which are the high-frequency filter and the low-frequency filter, is connected to a first connection point in the signal line, the first connection point being at a position relatively close to the signal generating section, the other of the filters is connected to a second connection point in the signal line, the second connection point being at a position farther from the signal generating section than is the first connection point, the signal generating section is configured to generate an intermediate AC signal that passes through both the high-frequency filter and the low-frequency filter, and the judgment section is configured to generate the intermediate AC signal from the signal generating section prior to conducting detection of the leakage current failure and the short-circuit failure, and, when a voltage of the intermediate AC signal that has passed through the filter connected to the first connection point is higher than a predetermined value and a voltage of the intermediate AC signal that has passed through the filter connected to the second connection point is lower than a predetermined value, to determine that the signal line has an open-circuit failure between the first connection point and the second connection point, or a measurement capacitor connected between the first connection point and the second connection point has a failure.

* * * * *